United States Patent [19]

Agusta et al.

[11] 3,740,620

[45] June 19, 1973

[54] STORAGE SYSTEM HAVING HETEROJUNCTION-HOMOJUNCTION DEVICES

[75] Inventors: Benjamin Agusta, Burlington; Joseph J. Chang, Shelburne, both of Vt.

[73] Assignee: International Business Machines Corporation, Armonk, N.Y.

[22] Filed: June 22, 1971

[21] Appl. No.: 155,498

[52] U.S. Cl.. 317/235 R, 317/235 Y, 317/235 AC, 317/235 K, 317/235 D

[51] Int. Cl. .............................................. H01l 19/00

[58] Field of Search................ 317/234 V, 235 AA, 317/235 AB, 235 AC, 235 AT; 307/324; 340/173 NR

[56] References Cited

UNITED STATES PATENTS

| | | | |
|---|---|---|---|
| 3,463,975 | 8/1969 | Biard | 317/235 |
| 3,634,927 | 1/1972 | Neale et al. | 317/235 |
| 3,443,175 | 5/1969 | Czorny et al. | 317/235 |
| 3,512,058 | 5/1970 | Khajezadeh et al. | 317/235 |
| 3,541,678 | 11/1970 | McDonald | 317/235 |
| 3,555,372 | 1/1971 | Hutson | 317/235 |
| 3,573,757 | 4/1971 | Adams | 317/235 |

FOREIGN PATENTS OR APPLICATIONS

| | | | |
|---|---|---|---|
| 1,189,656 | 3/1965 | Germany | 317/235 |

OTHER PUBLICATIONS

"Memory Cell Using Bistable Resistivity in Amorphous As–Te–Ge Film" Thesis by Sie Q. Iowa St. Univ., May 1969.

*Primary Examiner*—Jerry D. Craig
*Attorney*—Hanifin and Jancin and Francis J. Thornton

[57] ABSTRACT

This invention describes a homojunction transistor having a heterojunction diode formed on its emitter which can be used as a memory storage cell in a large capacity monolithic semiconductor memory array.

The heterojunction diode has two stable impedance states into which it can be switched to provide the memory portion of the element while the homojunction transistor provides an isolation voltage of a specified threshold value between the forward and reverse characteristics of the heterojunction diode.

The array can perform main storage, associated storage and logical functions and does not contain aberrant or "sneak" conductive paths through the memory that can provide false output signals.

The cell and a method of making it is disclosed. A storage system incorporating these memory cells or elements as an array is also disclosed.

7 Claims, 6 Drawing Figures

INVENTORS
BENJAMIN AGUSTA
JOSEPH J. CHANG

BY Francis J. Thornton

ATTORNEY

Patented June 19, 1973

3,740,620

2 Sheets-Sheet 2

STORAGE SYSTEM HAVING HETEROJUNCTION-HOMOJUNCTION DEVICES

RELATED APPLICATIONS

Application Ser. No. 46,943 filed on June 17, 1970, by H. J. Hovel and assigned to the same assignee as the present invention discloses a bistable switching diode that is useful as a non-volatile memory device which may be read non-destructively. The device, so disclosed, may be created by forming a heterojunction diode which exhibits stable high and low impedance states in which there is a high density of material imperfections including deep energy traps in one of the materials forming the heterojunction.

BACKGROUND OF THE INVENTION

1. Field of the Invention

This invention relates to monolithic integrated semiconductor structures including the fabrication thereof.

The invention further relates to an active storage array for digital signals with means for non-destructive readout.

2. Description of the Prior Art

Switching devices having two stable states with memory have been reported in, e.g., the IBM Journal of Research and Development, Vol. 13, No. 5, Sept., 1969. Particular attention is directed to one paper appearing on pages 510 through 514 entitled, "Characteristics of Semiconducting Glass Switching/Memory Diodes" and to another paper appearing on pages 515 through 521, entitled, "Physics of Instabilities in Amorphous Semiconductors." These papers teach that both semiconducting glass and amorphous semiconductors can exhibit either a high resistance state or a low resistance state.

Semiconductor junction devices have been known to the art for some time and have been classed as either homojunctions or heterojunctions. Homojunction devices, the best known, are formed by different dopants in a uniform body of elementary semiconductor material. The electrical characteristics of such devices are well known to the art. Generally, however, if a homojunction transistor is biased across its emitter and collector and its base is open or unbiased it exhibits a characteristic curve similar to that of a reversed biased diode in both forward and reverse directions. The breakdown voltages of the transistor depends on the characteristics of the emitter-base, collector base junctions and the forward and reverse current gains.

Heterojunctions on the other hand are formed of two different semiconductor materials joined together. Typically, such heterojunctions are formed of an elementary semiconductor material such as germanium or silicon and a compound semiconductor material such as a III–V or a II–VI compound material grown thereon. Generally, such heterojunction devices will also exhibit the conventional diode characteristics; that is, high forward conduction and low reverse conduction until breakdown is reached.

Additionally, some reports in the literature state that there has apparently been discovered in heterojunction devices an abnormal high impedance to low impedance transistion prior to avalanche. Still more recently certain semiconductor glasses and amorphous semiconductors have been reported in the literature as exhibiting at least three current controlled conduction states; i.e., a high resistance state, a low resistance state and a negative resistance state. These devices when appropriately pulsed can provide switching and memory functions. The mode of operation of such devices is, however, very poorly understood.

Consideration has been given to use such memory exhibiting devices in matrix arrays to provide logic and storage capabilities. Such matrix arrays include first and second sets of electrical conductors with the memory exhibiting devices interconnected therebetween. The first set of conductors are known as word lines and the second set of conductors are known as bit lines, and the memory exhibiting devices are interconnected between these sets of lines at selected crossover points. Each device at such an interconnection or crossover point may be thought of as a bit location with the device at the crossover point representing, in binary language, either a 1 or a 0 depending upon its impedance state. A particular bit may be written into by applying simultaneously a current or voltage on one line of each set of conductors. Reading of the stored information may be performed by applying a current or a voltage on a word line and detecting a response on one or more of the bit lines which are coupled to the word lines by such memory exhibiting devices or cells.

Such memory exhibiting devices, as are known to the prior art, however, can have undesired alternate or "sneak" electrical paths in a memory array.

SUMMARY OF THE INVENTION

The present invention thus describes a bistable switching and memory device comprising a homojunction transistor having a heterojunction diode formed on its emitter and which exhibits a bistable switching and memory characteristic having a high threshold voltage level that must be exceeded before the actual impedance state of the device can be determined.

It is an object of the invention to provide a semiconductor memory cell that is non-volatile under zero voltage conditions.

It is another object of the invention to provide a memory cell that can be easily fabricated and is compatible with present solid state integrated circuit technologies and techniques.

It is still another object of the invention to provide a memory array in which the problem of alternate or sneak electrical paths that can give false readings is eliminated.

The foregoing and other objects, features and advantages of the invention will be apparent from the following more particular description of preferred embodiments of the invention, as illustrated in the accompanying drawings.

DESCRIPTION OF THE INVENTION

Figures 1, 2, 3, 4:
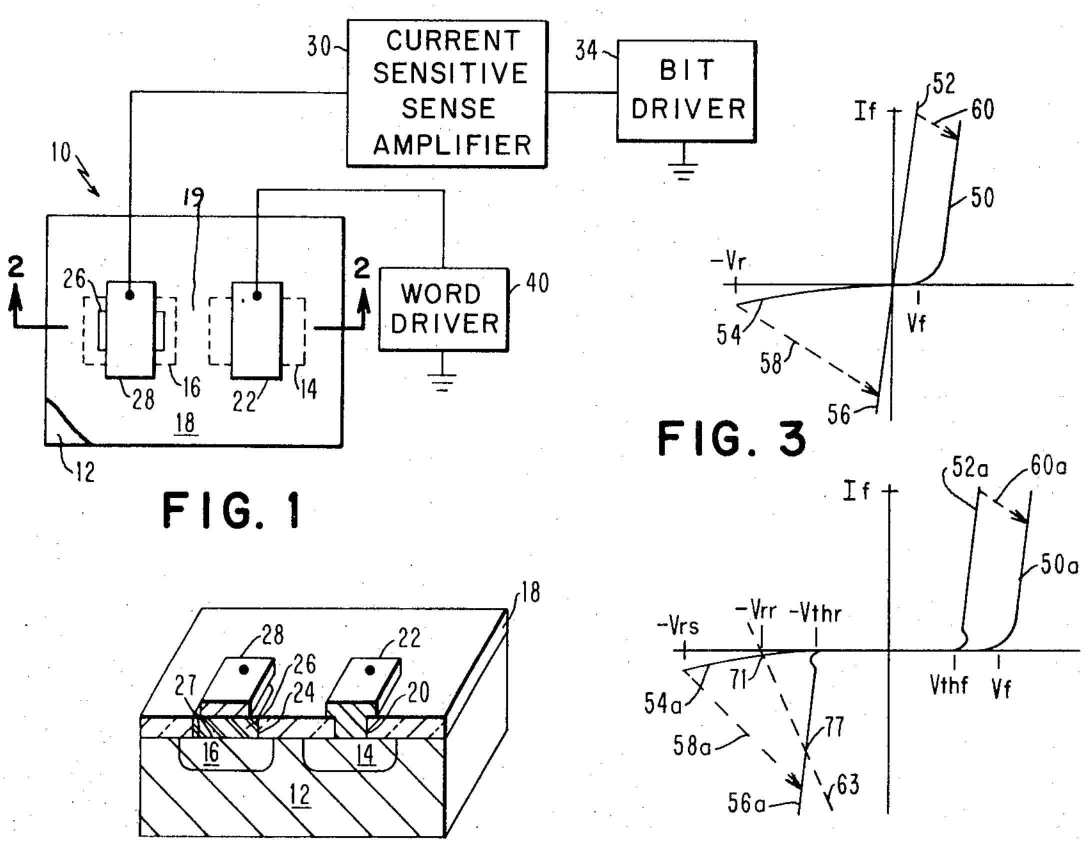
FIG. 1 illustrates an embodiment of the heterojunction-homojunction semiconductor device of the present invention used as a single memory cell.
FIG. 2 is a cross-sectional view of the device of FIG. 1 taken along the lines 2—2.
FIG. 3 shows the voltage-current characteristics of the heterojunction used in the present invention.
FIG. 4 shows the voltage current impedance characteristics of the heterojunction-homojunction device of the present invention in open base operation.

Referring to the drawings in more detail there is shown, in FIGS. 1 and 2, an embodiment of the semiconductor storage system of the present invention which for purposes of illustration only is limited to a single bit cell 10 having a heterojunction-homojunction transistor device built in accordance with the present invention. The cell 10 preferably is formed of a body 12 of homogeneous elementary semiconductor material having a diffused collector region 14 and a diffused emitter region 16 formed therein. For purposes of illustration it will be assumed that the body 12 is formed of N type germanium or silicon having a dopant concentration of $3 \times 10^{16} cm^{-3}$, and the regions 14 and 16 are diffused *P* type regions with a one micron base region 19 separating them. Overlying the surface of body 12 is an insulating layer 18 which may be formed, for example, from silicon dioxide.

The portion of the device thus described is in all respects a homojunction transistor. The methods and techniques for producing and using such homojunction transistors are well known to the prior art and are conventional.

A conductive strip 22 can be made to contact, through an opening 20 in the oxide layer 18, the collector region 14. A deposit 26 of a selected material that will form a heterojunction 27 with the region 16, is laid down, in the opening 24, over the emitter region 16, and is contacted by a conductive strip 28.

The described memory cell must be not only capable of assuming either of two different impedance states; i.e., a low impedance state or a high impedance state, but also have certain voltage-current characteristics such that when such cells are incorporated in a memory array, the array will not contain "sneak" current paths that can give false readings as to the impedance state of any particular cell.

To achieve the desired impedance states in the cell, the deposit 26 must be such that a heterojunction 27 which can assume two different bistable impedance states, is formed with the emitter region 16.

The desired impedance states are realized by providing deposit 26 with a selected thickness and a density of crystalline defects including stacking faults, dislocations and energy traps greater than its dopant density. It has been found that stacking faults of a density of $10^4$ per square centimeter, dislocations of a density $10^5$ per square centimeter and energy traps of a density of $10^{12}$ per cubic centimeter would be adequate when deposit 26 has a reasonably high resistivity, say $10^8$ ohm-cm or greater. When however deposit 26 has increased dopants therein, its resistivity level is necessarily lower, and its trap density must be correspondingly increased.

The thickness of deposit 26 is important since the magnitude of the reverse breakdown voltage of heterojunction 27 increases proportionately with an increase in thickness of deposit 26 and the switching speed of the device varies inversely with the thickness. To balance these two factors and to obtain effective preferred results the deposit 26 should have a thickness of between 0.1 and 2.0 microns.

A deposit of material that will exhibit sufficient crystalline imperfections, material defects, traps, etc., to provide bistable impedance characteristics in accordance with the present invention may be formed on the emitter region 16 by the following technique.

Following the diffusion of the emitter region 16 and the collector region 14 in the body 12, the homojunction transistor thus formed is masked with a suitable material such as silicon dioxide and an opening 24 is provided in the oxide over the emitter region 16. The transistor thus masked is, together with a source of N type III–V material, such as, gallium phosphide (GaP), placed in a suitable chamber. The gallium phosphide material is then heated to a temperature of between 650° to 800° C. A hydrogen-hydrochloric acid atmosphere is introduced into the chamber to remove particles of gallium phosphide from the source and epitaxially deposit the particles onto the emitter region 16. The concentration of hydrochloric acid vapor is not particularly critical and may range anywhere between 0.01 percent and 10 percent of the total atmosphere. However, for thin layers of deposit 26, a low concentration of hydrochloric acid vapor of approximately 0.1 percent or below is particularly desirable. The gallium phosphide should be maintained at the specified temperature for at least ten minutes to form deposit 26 on the emitter region 16. Deposit 26 can be formed with a thickness of a fraction of a micron or with a thickness of several tens of microns depending upon the breakdown voltage, etc., that is desired. The final thickness of deposit 26 depends upon the length of time the process continues, the temperature at which it is performed and, etc.

N type doping in the gallium phosphide can be achieved by having a suitable dopant impurity such as tin, tellerium, selenium, etc., previously incorporated in the gallium phosphide source material. Alternately, doping can be achieved during fabrication by placing pieces of the dopant material in the chamber and heating it together with the gallium phosphide material. Still further, doping could be achieved during fabrication by introducing the dopant as a gaseous species as is well known in the semiconductor art. To assure that the surface of region 16 is clear of undesirable oxides, the surface may be treated by heating in pure hydrogen prior to the growth of deposit 26 at suitable temperatures. Additional details for fabrication of such heterojunctions is contained in the referenced co-pending Application Serial No. 46943.

Following the deposition of the appropriately doped gallium phosphide layer on the surface of the emitter 16, electrical contacts can be made to both deposit 26 and the collector region 14.

This is accomplished by producing an opening in layer 18 over the collector region 14 and forming through photolithographic techniques the metallic electrode strip 22, composed for example of aluminum or tin, in contact with region 14 through the opening 20. Similarly, a metallic strip 28 is formed in contact with deposit 26. Suitable materials, for contact to deposit 26, are indium, tin or gold-tin alloys.

It should be understood that although the method and device described above for forming deposit 26 used N type gallium phosphide, that P type gallium phosphide may also be employed if the emitter region 16 were N type. It should also be noted that other III–V or II–VI compound materials may be used in place of the described gallium phosphide.

FIG. 3 shows the current-voltage characteristics of the heterojunction 27 built in accordance with the above process. This heterojunction 27 can exhibit two distinct impedance states under both forward and reverse bias conditions. Under forward bias conditions the high impedance state is indicated by line 50 and the low impedance state by line 52. Under reverse bias conditions the high impedance state is indicated by line 54 and the low impedance state by line 56.

Under forward bias conditions, that is, when deposit 26 is negative with respect to region 16 the junction 27 passes very little current when it is in its high impedance state until the applied voltage exceeds Vf whereupon an increasing current for relatively small increases in voltage flows across the junction 27 as indicated by line 50.

Under reverse bias conditions, that is, when deposit 26 is positive with respect to region 16, the heterojunction 27, when in its high impedance state, passes little or no current, as indicated by line 54, untill the applied reverse voltage reaches the reverse voltage −Vr whereupon the device switches, as indicated by dotted line 58, to the low impedance state depicted by line 56.

When the device is in the low impedance state as depicted by lines 52 and 56, a substantial flow of current occurs across the heterojunction 27 under both the forward and reverse bias conditions. Recurrence of the high impedance state depicted by lines 50 and 54 can be obtained by driving the heterojunction 27 into the forward bias condition along line 52 until the forward switching current If is reached. At this point the device switches, as shown by dotted line 60, back to its high impedance state, depicted by line 50.

Again the device can be returned back to its low impedance state by driving the device through the coordinate zero to a voltage in excess of −Vr.

An important aspect of the memory and switching characteristics of such heterojunction devices lies in the fact that the device remembers or retains its impedance state when all sources of potential are removed therefrom. For example, when the device is in its low impedance state, depicted by the lines 56 and 52, and the source of bias is removed, the device relaxes to zero voltage or near zero voltage. However, upon re-application of a bias voltage having a magnitude less than the forward voltage Vf or the reverse voltage −Vr, the device demonstrates its retentive character by again exhibiting its low impedance characteristic curve. Similarly, when the device is in its high impedance state indicated by line 50 and line 54, it will remain indefinitely in that state, and upon re-application of a potential voltage, insufficient to cause switching, the device follows the high impedance characteristic line 50, 54. The retention of its impedance state at zero or near zero bias is known to exist for several weeks. However, the retention or persistence times of the device decreases as a function of quiescent forward bias voltage and increases as a function of quiescent reverse bias voltage.

This phenonmenon is believed to be a result of an electronic switching mechanism which involves the emptying and filling of traps at the crystalline defects in the deposit 26. The sequence of events might be as follows: when positive potential is applied to reverse bias the junction 27, a small leakage current results due to electron flow from the GaP, forming deposit 26, to the conductive strip 28. The electrons extracted from the GaP are re-supplied by the emitter region 16. As the potential is increased to −Vr, field-ionization or impact-ionization of deep trap levels occurs causing the traps to be emptied of charge carriers. The trap emptying provides a highly conducting path through both the material 26 and the junction 27 by a mechanism as yet not understood. Once emptied, the traps remain so as long as the positive potential is maintained. Even when the potential is reduced to zero, the traps continue to remain empty due to a combination of low capture cross-section and few available free electrons relative to the number of empty traps.

However, when a negative potential is applied, to forward bias the junction 27, electrons are injected from conductive strip 28 into the GaP material and refill the empty traps. When a sufficient number of traps become filled, at If, the high conduction mechanism is destroyed and the device switches into its high impedance state.

Since, however, the heterojunction 27 is formed on region 16 which serves as an emitter for a homojunction transistor, the current-voltage characteristics of the heterojunction 27 becomes modified by the homojunction transistor which imposes an isolation or threshold voltage between the forward and reverse characteristics of the heterojunction.

FIG. 4 shows these current-voltage characteristics of the heterojunction-homojunction device of the present invention. The device exhibits two distinct states under both forward and reverse bias conditions similar to that shown in FIG. 3, but only after a specific isolation or threshold voltage is exceeded. Until this specific threshold voltage is exceeded, the device exhibits in all cases only a high impedance, in the order of hundreds of megohms.

Under forward bias conditions the device passes very little current; e.g., in the order of pico amps, whether it is in its high impedance state or its low impedance state until the forward threshold voltage Vthf is exceeded. Then, if it is in its low impedance state, a substantial flow of current; e.g., in the order of milliamps, is observed as indicated by line 52*a*. However, if it is in its high impedance state, no substantial current flow is observed until the applied voltage exceeds Vf whereupon the device proceeds to provide continuously, an increasing current in the order of milliamps for relatively small increases in voltage as indicated by line 50*a*.

Similarly, under reverse bias conditions, the device passes very little current; e.g., in the order of picoamps until at least the reverse threshold voltage −Vthr is exceeded. Once the applied reverse voltage −Vthr is exceeded, then if the device is in its low impedance state high current flow in the order of milliamps is observed as indicated by line 56*a*. However, if it is in its high impedance state, a very small current flow in the order of microamps is observed as indicated, by line 54*a*, until the applied reverse voltage reaches −Vrs whereupon the device will switch as indicated by dotted line 58*a* to the low impedance state depicted by line 56*a* where it exhibits a current flow in the order of milliamps.

When the device is in the low impedance state, depicted by lines 52*a* and 56*a*, recurrence of the high impedance state, depicted by lines 50*a* and 54*a*, can be obtained by driving the device past the forward threshold voltage Vthf and into the forward bias condition along line 52a until the forward switching current If is reached. At this point the device switches, as shown by dotted line 60a, back to its high impedance state, depicted by line 50a.

Again the device can be returned back to its low impedance state by driving the device through the coordinate zero past the reverse threshold voltage −Vthr to a voltage in excess of the switching voltage −Vrs.

For the described heterojunction-homojunction transistor device, the following are typical voltages $Vf = 3$ volts, $Vthf = 2$ volts, $-Vthr = -2$ volts and $-Vrs = -7$ volts or higher.

Figure 5:
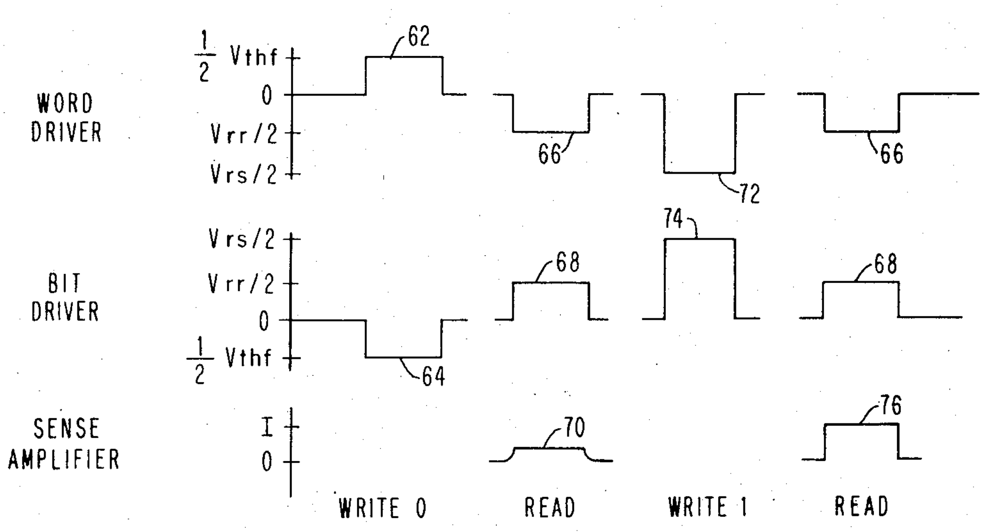
FIG. 5 illustrates the pulse pattern used to read and write binary information into the memory cell of FIG. 1.

With continued reference to FIG. 1 and with reference to FIG. 5 the operation of the invention, as a memory cell, will be described. The conductive strip 28 serves as a bit line and is connected, through a conventional current sensitive sense amplifier 30, to a conventional bit driver 34 which is capable of impressing on the bit line both positive and negative potentials of various levels. The other conductive strip 22 serves as a word line and is connected to a conventional word line driver 40 capable of impressing on strip 22 both positive and negative potentials of various levels.

For purposes of illustration only, it will be assumed that the high impedance state of the device, when read under reverse bias conditions, as indicated by line 54a, of FIG. 4, will represent a binary 0 and the low impedance state, when read under reverse bias conditions, as indicated by line 56a, will represent a binary 1.

In operation of the embodiment illustrated in FIGS. 1 and 2 of the drawing, to store information in the cell 10, the cell 10 must be set in either a high impedance state or a low impedance state. Accordingly, it will be assumed that the device is in its low impedance state and that a 0 is to be written into the cell. To store a 0 bit of information in the device of FIG. 1, a positive voltage pulse 62 is applied to the word line 22 and a negative voltage pulse 64 is applied to the bit line 28 to cause the device to switch to its high impedance state, by driving the device through the coordinate zero, into the forward bias condition, and forcing a current equal to the forward switching current If through the device. When the current flowing through the heterojunction 27, existing between layer 26 and region 16 exceeds If, the heterojunction 27 will be driven into the high impedance state indicated by line 50a in which state it will remain indefinitely.

Since, as noted above, the cell has a typical forward threshold voltage Vthf, of 2 volts, the voltages impressed on the word and bit lines must together exceed this threshold voltage of 2 volts before switching will occur. Thus voltages equal to slightly more than one-half Vthf must be applied coincidentally to both the bit line and the word line before the device can be driven into its forward bias switching condition.

Reading of the cell; i.e., determining its impedance state, is preferably performed when the cell is in the reverse bias condition.

Thus to be able to determine the impedance state of the device under reverse bias conditions, the applied bit and word voltages must, when added together, exceed the reverse threshold voltage −Vthr, but be lower than the switching voltage −Vrs. As indicated above, the reverse threshold voltage −Vthr, of the described device, is typically −2 volts and the reverse switching voltage −Vrs, is −7 volts. Thus a suitable reverse read voltage −Vrr would be above −2 volts, but less than −7 volts. Accordingly, application of a positive voltage pulse 68 equal to Vrr/2 (say 1.5 volts) to the bit line 28, from the bit driver 34 together with the simultaneous application of negative voltage pulse 66 which is also equal to Vrr/2 to the word line from the word driver 40, applies a reverse read voltage −Vrr of about 3.0 volts across the device. Accordingly, at this reverse read voltage −Vrr, the cell, being in the high impedance state, permits only a small current in the order of microamps to flow therethough. Thus, as indicated by pulse 70 of FIG. 5, the sense amplifier 30 receives only a small current in the order of microamps. This small current flow is also indicated in FIG. 4 by the point 71 at which the load line 63 crosses the curve 54a. Thus the low current passing through the device when read, under reverse bias conditions, is indicative of a binary 0.

A binary 1 may be written into the cell by concurrently applying a negative voltage pulse 72 to the word line 22 and a positive voltage pulse 74 to the bit line 28. Because the heterojunction 27 will not change from its high impedance state to its low impedance state until the reverse switching voltage −Vrs is exceeded, it is therefore necessary that the applied bit and word voltages, when writing 1 into the cell, together exceed the reverse switching voltage −Vrs. When these voltages exceed −Vrs, the device switches along line 58a into its low impedance state which is indicative of a binary 1. Of course, as noted above, once switched the cell remains in this low impedance state for a long period of time or until it is driven by a sufficient forward voltage to cause it to switch back to the high impedance state.

Reading of 1 in the cell is also performed under reverse bias conditions and with the applied voltages as were used to read a 0. Accordingly, a positive voltage pulse 68 is again applied to the bit line 22 coincidentally with the negative voltage pulse 66 applied to the word line 28. The cell being in the low impedance state permits a large current in the order of milliamps to flow therethrough. Thus as indicated by pulse 76 of FIG. 5, the sense amplifier 30 receives a large current indicative of a binary 1.

This current is also illustrated in FIG. 4, by the point 77 at which the load line 63 crosses the curve 56a. Thus the high current passing through the device under reverse bias conditions is indicative of a binary 1.

It is especially to be noted that the device exhibits a forward threshold voltage Vthf and a reverse threshold voltage −Vthr which are separated by a substantial voltage differential. It is this characteristic that makes the semiconductor device of the invention particularly useful in memory arrays, for it is this characteristic that eliminates the possibility of "sneak" paths and erroneous readings of stored information.

Figure 6:
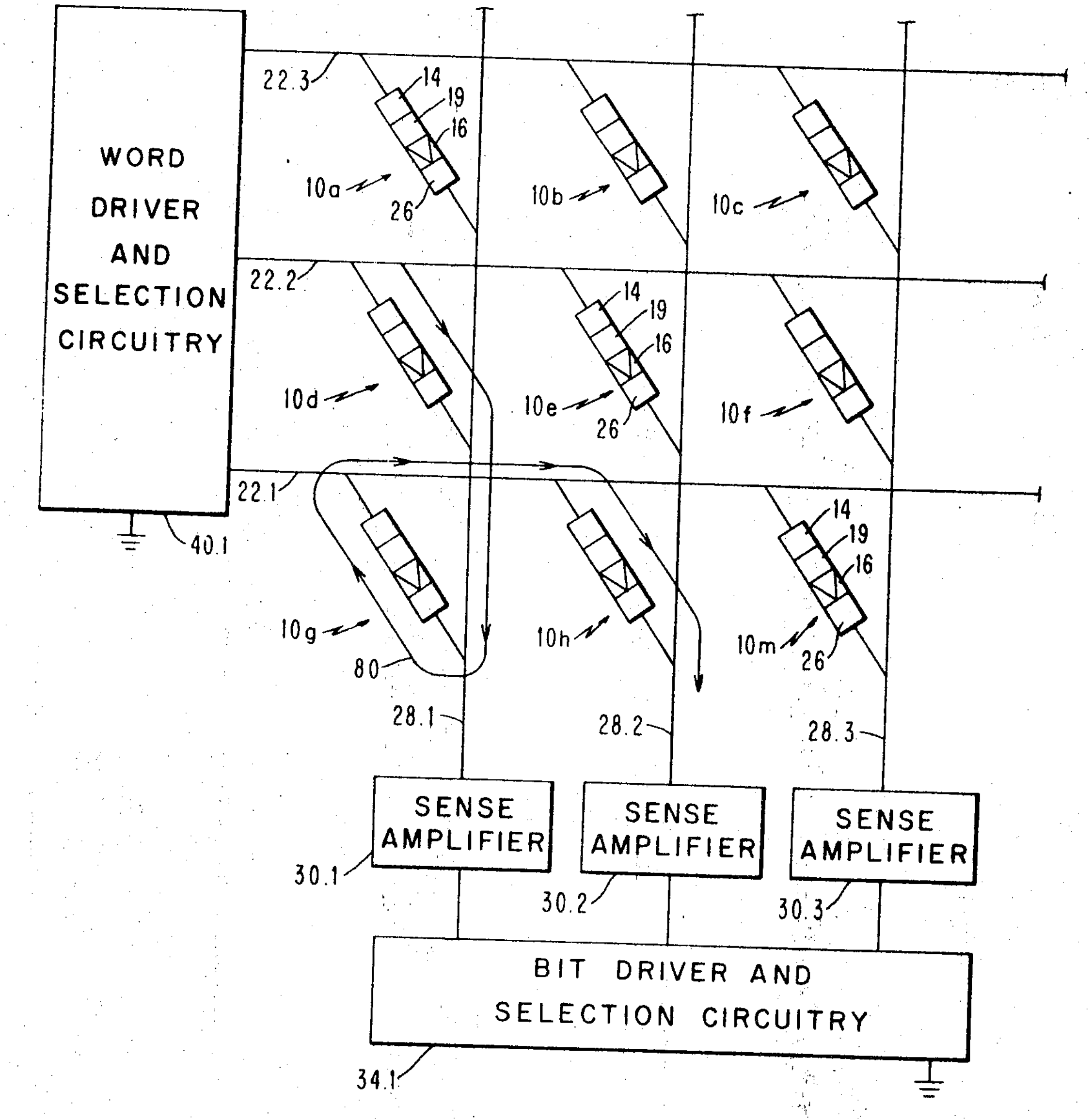
FIG. 6 shows a storage system of the present invention which includes an integrated semiconductor array having a plurality of heterojunction-homojunction memory devices of the present invention incorporated therein.

This feature of the invention will be particularly described and amplified upon in FIG. 6 of the drawing where there is illustrated an embodiment of the present invention which includes in a planar array of a plurality of memory devices made in accordance with the invention. The system has a plurality of vertical bit lines 28.1, 28.2 and 28.3, each of which is connected through a respective sense amplifier 30.1, 30.2 and 30.3 to a bit driver 34.1, a plurality of horizontal word lines 22.1, 22.2 and 22.3, which are in turn connected to a word driver and selection circuit 40.1, crossing the bit lines are a plurality of memory cells 10a, 10b, 10c, 10*d*, 10*e*, 10*f*, 10*g*, 10*h* and 10*m* interconnecting the word lines and the bit lines at each intersecting point. As shown in FIG. 6, each memory cell comprises a collector 14, a base region 19, an emitter 16 and a heterojunction layer 26. The word lines are connected to the collectors and the bit lines to the heterojunction layers.

The bit drive means 34.1 provides a function of bit addressing and pulse generation corresponding to the bit line driver 34 of the system of FIG. 1.

In operation of the system illustrated in FIG. 6 of the drawing when 1 and 0 bits of information are to be written into the memory cells, the word selection and drive means 40.1 are coincidentally operated in conjunction with the bit selection and drive means 34.1 to apply appropriate voltage conditions to the selected cells to place the selected cells into the desired impedance state in the manner described, in connection with the writing of 1 and 0 bits of information, in the system of FIG. 1 and 2.

The use of the described cell in the array of FIG. 6 avoids the problem of "sneak" current paths through the array because of the threshold voltage that must be exceeded before the true impedance state of a memory cell can be determined.

This avoidance of sneak current paths can best be understood from the following example.

Let is be assumed that the central cell of the array of FIG. 6, that is, cell 10*e* at the intersection of bit line 28.2 and word line 22.2, is in its high impedance state; e.g., storing a 0 and all the other cells are in their low impedance states; e.g., storing a 1.

Now if a negative read voltage pulse 66 equal to one-half Vrr, is applied to word line 22.2 and a positive read voltage pulse 68 equal to one-half Vrr is coincidentally applied to bit line 28.2, the central cell 10*e* has a total voltage of −Vrr applied thereto. As indicated in FIG. 4, this voltage −Vrr is greater than the reverse threshold voltage −Vthr, but less than the reverse switching voltage −Vrs, and is sufficient to read the impedance state of the cell 10*e*. Thus a low amplitude pulse 70 in the order of microamps is received by sense amplifier 30.2.

By virtue of the application of read pulse 66 on word line 22.2, cells 10*d* and 10*f* are also biased to a level one-half Vrr. Similarly cells 10*b* and 10*h* are biased to the level one-half Vrr by application of the voltage pulse 68 to bit line 28.2. However, since none of these devices have applied thereto, a voltage in excess of either the reverse voltage −Vthr or the forward threshold voltage Vthr, they each exhibit, at this applied voltage level, a resistance in the order of hundreds of megohms and any current flow therethrough is in the order of picoamps. Since each cell, other than cell 10*e*, regardless of its true impedance state only exhibits a high impedance in the order of hundreds of megohms, even many cells considered together will not contribute a sufficient current flow to sense amplifier 30.2 that will be sufficient to falsely indicate a 1 in cell 10*e*.

A potential leakage path when using cells other than that described by the present invention might be, for example, when reading cell 10*e*, through cell 10*d*, in the forward direction, down bit line 28.1, through cell 10*g*, in the reverse direction, along word line 22.1, to cell 10*h*, through cell 10*h* in the forward direction to bit line 28.2 to falsely indicate a 1 in cell 10*e*. This path is indicated by the looped arrowed path 80 in FIG. 6.

However, when using the cells of the present invention, such sneak paths cannot possible contribute current flow sufficient to cause erroneous readings even when the loop includes many hundreds of cells.

Consider, for example, the following case; all cells, except cell 10*e*, are in their low impedance state and cell 10*e* is in the high impedance state, also word line 22.2 has a read voltage pulse 66 equal to one-half Vrr applied thereto and each bit line 28.1, 28.2 and 28.3 are also biased to one-half Vrr by the application of read voltage pulse 68.

Thus cells 10*d*, 10*e* and 10*f* each have a total voltage of −Vrr applied thereto and each will pass a current indicative of its impedance state. At the same time, cells 10*g* and 10*a* also have a voltage of one-half Vrr applied thereto by bit line 28.1 and cells 10*h* and 10*b* have the same voltage applied to it from bit line 28.2. However, this voltage one-half Vrr is insufficient to bias any of these cells 10*g*, 10*h* and 10*b* above the threshold voltage −Vthr; thus both cells remain in their below threshold state where they exhibit a high impedance. Thus each device contributes only a minute current flow in the order of picoamps when it is biased below Vthr even though it is in the low impedance state.

Thus there has been described a bistable memory that can be read out non-destructively and which effectively eliminates sneak paths or effectively reduces them to such a low level that they are inconsequential and can be disregarded. The described memory celis have the further advantages in that they are non-volatile under zero voltage conditions, are easily fabricated and compatible with present solid state integrated circuit technologies and techniques.

In some instances it may be desirable to diffuse the base region as well as the emitter and collector regions.

Additionally, although a lateral transistor is shown in the figure it should be noted that other types could be used.

Still further, any bistable resistor element such as Niobium Oxide ($Nb_2O_5$) or a semiconducting glass; or an amorphous silicon could be used in place of the described heterojunction device.

It should now be understood and obvious to one skilled in the art that the heterojunction forming material having bistable impedance states could be formed on the collector region instead of forming it on the emitter.

While the invention has been particularly shown and described with reference to preferred embodiments thereof, it will be understood by those skilled in the art that the foregoing and other changes in form and details may be made therein without departing from he spirit and scope of the invention.

What is claimed is:

1. A non-volatile storage system comprising a high threshold voltage level semiconductor device exhibiting a bistable impedance and a memory characteristic including a body of semiconductor material having a first region of a first conductivity type and second and third regions of second conductivity type forming first and second homojunctions with the first region and a deposit of heterojunction-forming material on said second region forming a heterojunction with said second region, and means for storing information in said device comprising voltage means coupled to said heterojunction-forming material, and said third region for applying a voltage across said heterojunction and said homojunctions to cause said first, second and third regions to operate as an open base transistor and to cause said heterojunction forming material in conjunction with said second region to exhibit at a voltage having a value less than a threshold voltage, a high impedance and at a voltage having a value greater than the threshold voltage alternately exhibit a stable high impedance and a stable low impedance.

2. A storage system as set forth in claim 1 wherein said heterojunction-forming material is characterized by a concentration of dopants and a concentration of defects greater than the concentration of dopants.

3. A storage system as set forth in claim 1 wherein there is further provided and coupled to said voltage means, means for sensing the impedance state of said device.

4. The storage system as set forth in claim 1 wherein said first, second and third regions form a transistor said first region comprising the base region of the transistor, said second region comprising the emitter region of the transistor and said third region comprising the collector region of the transistor.

5. The storage system as set forth in claim 1 wherein said first, second and third regions form a transistor said first region comprising the base region of the transistor, said second region comprising the collector region of the transistor and said third region comprising the emitter region of the transistor.

6. The system of claim 1 wherein said body of semiconductor material is taken from the group consisting of silicon and germanium and said heterojunction-forming material is taken from the class consisting of gallium phosphide, zinc selenide, gallium arsenide, gallium arsenide phosphide, cadmium sulphide, zinc sulphide, cadmium tellurium and zinc cadmium selenide.

7. The system of claim 1 wherein said body of semiconductor material is an elemental semiconductor material and said heterojunction-forming material is a compound semiconductor material.

* * * * *